(12) United States Patent
Chang et al.

(10) Patent No.: US 9,930,795 B2
(45) Date of Patent: Mar. 27, 2018

(54) ELECTRONIC DEVICE HAVING A REMOVABLE HANDLE

(71) Applicant: Getac Technology Corporation, Hsinchu County (TW)

(72) Inventors: Chia-Wei Chang, Taipei (TW); Hsi-Yang Yeh, Taipei (TW)

(73) Assignee: GETAC TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 15/232,154

(22) Filed: Aug. 9, 2016

(65) Prior Publication Data

US 2018/0049332 A1    Feb. 15, 2018

(51) Int. Cl.
   *H05K 5/02*         (2006.01)
   *F16M 11/24*        (2006.01)

(52) U.S. Cl.
   CPC .............. *H05K 5/023* (2013.01); *F16M 11/24* (2013.01); *H05K 5/0234* (2013.01)

(58) Field of Classification Search
   CPC .. G06F 1/1679; H05K 5/0017; H05K 5/0217; H05K 5/0234; H05K 5/023; F16M 11/24
   USPC ............ 361/679.01, 679.02, 679.06, 679.15, 361/679.3, 679.27, 679.56, 755, 728–730, 361/807, 809, 810
   See application file for complete search history.

(56) References Cited

U.S. PATENT DOCUMENTS

| | | | | |
|---|---|---|---|---|
| 5,721,668 A * | 2/1998 | Barrus | ................... | G06F 1/1616 361/679.59 |
| 6,115,883 A * | 9/2000 | Um | ........................ | F16M 11/10 16/405 |
| 7,206,198 B2 * | 4/2007 | Wang | ..................... | G06F 1/1616 312/223.1 |
| 7,342,778 B2 * | 3/2008 | Fan | ........................ | G06F 1/1613 16/445 |
| 7,450,372 B2 * | 11/2008 | Lin | ........................ | G06F 1/1626 361/679.55 |
| 7,576,981 B2 * | 8/2009 | Kuo | ..................... | E05B 73/0005 361/679.57 |
| 7,612,998 B2 * | 11/2009 | Fan | ........................ | G06F 1/1616 361/679.55 |
| 7,929,298 B2 * | 4/2011 | Hsu | ......................... | G06F 1/166 361/679.12 |
| 8,050,027 B2 * | 11/2011 | Liang | ...................... | G06F 1/187 361/679.37 |
| 8,508,937 B2 * | 8/2013 | Chen | ..................... | G06F 1/1628 345/179 |

(Continued)

*Primary Examiner* — Steven T Sawyer
*Assistant Examiner* — Sagar Shrestha
(74) *Attorney, Agent, or Firm* — Locke Lord LLP; Tim Tingkang Xia, Esq.

(57) ABSTRACT

An electronic device having a removable handle is provided and includes a handle, two connecting elements, and a body. The handle is coupled to the body through the connecting elements to allow a user to change the handle through the connecting elements as needed, thereby rendering the use of the handle highly flexible. Bumps of the connecting elements are disposed at concave portions on the body, respectively. The fastening components fasten the connecting elements to the body. Therefore, the connecting elements are firmly coupled to the body to enhance overall structural stability after assembly and usage safety of using the handle to carry the body.

9 Claims, 7 Drawing Sheets

(56) References Cited

U.S. PATENT DOCUMENTS

| | | | | |
|---|---|---|---|---|
| 8,567,014 B1* | 10/2013 | Huang | ............... | B25G 1/06 |
| | | | | 16/405 |
| 8,670,233 B2* | 3/2014 | Huang | ............... | G06F 1/1613 |
| | | | | 16/429 |
| 9,187,021 B2* | 11/2015 | Kajio | ............... | B60N 3/023 |
| 9,471,096 B2* | 10/2016 | Kuo | ............... | F16M 11/00 |
| 2004/0114332 A1* | 6/2004 | Lee | ............... | H01L 23/4093 |
| | | | | 361/719 |
| 2006/0104020 A1* | 5/2006 | Fan | ............... | G06F 1/1613 |
| | | | | 361/679.55 |
| 2008/0158806 A1* | 7/2008 | Kuo | ............... | E05B 73/0005 |
| | | | | 361/679.57 |
| 2008/0186665 A1* | 8/2008 | Kuo | ............... | E05B 17/2038 |
| | | | | 361/679.57 |
| 2010/0177467 A1* | 7/2010 | Wang | ............... | G06F 1/1616 |
| | | | | 361/679.01 |
| 2010/0301717 A1* | 12/2010 | Wang | ............... | G06F 1/1616 |
| | | | | 312/223.1 |
| 2011/0225771 A1* | 9/2011 | Bartnick | ............... | B60N 3/023 |
| | | | | 16/429 |
| 2011/0273850 A1* | 11/2011 | Chen | ............... | H05K 5/0221 |
| | | | | 361/726 |
| 2012/0020019 A1* | 1/2012 | Chen | ............... | G06F 1/1656 |
| | | | | 361/679.59 |
| 2012/0044624 A1* | 2/2012 | Hoffman | ............... | G06F 1/1628 |
| | | | | 361/679.21 |
| 2012/0257342 A1* | 10/2012 | Shindo | ............... | H05K 5/023 |
| | | | | 361/679.02 |
| 2014/0317913 A1* | 10/2014 | Lu | ............... | H05K 5/023 |
| | | | | 29/762 |

* cited by examiner

ELECTRONIC DEVICE HAVING A REMOVABLE HANDLE

BACKGROUND OF THE INVENTION

Field of the Invention

The present invention relates to an electronic device having a removable handle.

Description of the Prior Art

Habitual electronic device users are happy with the trend toward lighter, thinner and smaller electronic devices as well as the increasingly high portability of electronic devices. To enhance, and meet the need for, the portability of electronic devices, a conventional electronic device is typically equipped with a handle whereby users carry the electronic device.

Since the handle is regarded as an unimportant accessory to the conventional electronic device, the conventional electronic device seldom comes with a handle replacement function. As a result, handle replaceability is never a factor in the design of the structure of coupling the handle and the conventional electronic device together. Therefore, electronic device users cannot change the handle as needed. In view of this, the prior art has room for improvement in handle adaptability.

Moreover, not only is the handle directly fastened to the conventional electronic device in a single direction with screwing elements, but little considerations are given to the further enhancement of the functionality or structural strength of a related structure of assembly. Therefore, the safety of using the handle to carry the conventional electronic device is at risk, as the electronic device being carried with the handle by a user is likely to get damaged when the handle suddenly comes off the electronic device. Therefore, there is room for improvement in the safety of using the handle directly fastened to the conventional electronic device in a single direction to carry the conventional electronic device.

SUMMARY OF THE INVENTION

An electronic device having a removable handle is provided by the present invention to enhance the ease of changing the handle as needed and eliminate the safety risks of using the handle directly fastened to the electronic device in a single direction.

The electronic device having a removable handle comprises a body, two connecting elements, and a handle. The body has two concave portions disposed on two opposing lateral sides of the body, respectively. The two connecting elements are disposed on the two opposing lateral sides of the body having the concave portions, respectively. The connecting elements each comprises a base, a pivotal connection unit, and a plurality of fastening components. The base comprises a bump penetrating one of the concave portions of the body. The fastening components penetrate the base and get fastened to the body. The pivotal connection unit is fixedly disposed at the base and comprises a pivotal connection hole and a mounting recess. The handle is pivotally disposed at the connecting elements and comprises a grip element, two pivotal connection shafts and two pivotal bolts, with the pivotal connection shafts disposed at two ends of the grip element and penetratingly disposed at the mounting recesses, respectively, and the pivotal bolts penetrating the pivotal connection holes to be penetratingly disposed at the pivotal connection shafts, respectively.

Therefore, a user can change the handle through the connecting elements as needed, thereby rendering the use of the handle highly flexible. The bumps of the connecting elements are engaged with the concave portions on the body such that the connecting elements get fastened to the body through the fastening components. Therefore, the connecting elements can be coupled to the body more firmly, thereby enhancing the overall structural stability after assembly.

DETAILED DESCRIPTION OF THE EMBODIMENTS

Figure 1:
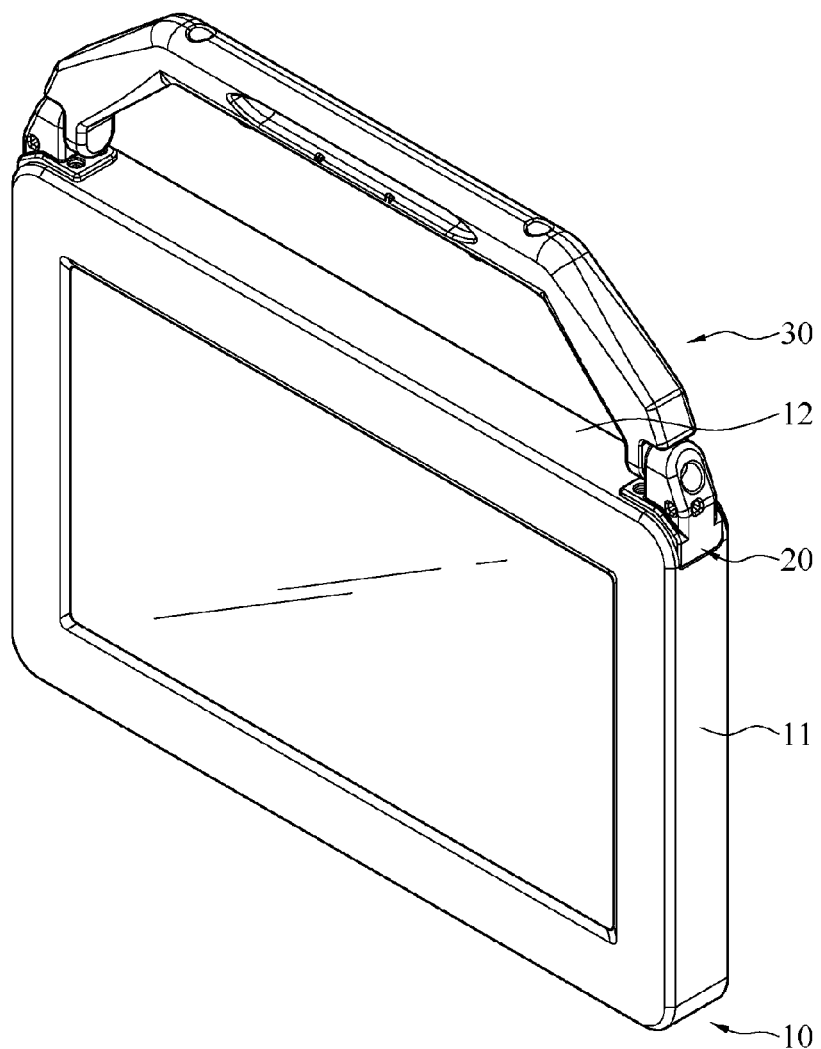
FIG. 1 is a perspective view of an electronic device having a removable handle according to the present invention.

An electronic device having a removable handle is provided according to an embodiment of the present invention. FIG. 1 is a perspective view of an electronic device having a removable handle according to the present invention. The electronic device having a removable handle comprises a body 10, two connecting elements 20, and a handle 30. The body 10 comprises two opposing lateral sides 11 and a top side 12.

Figure 2:
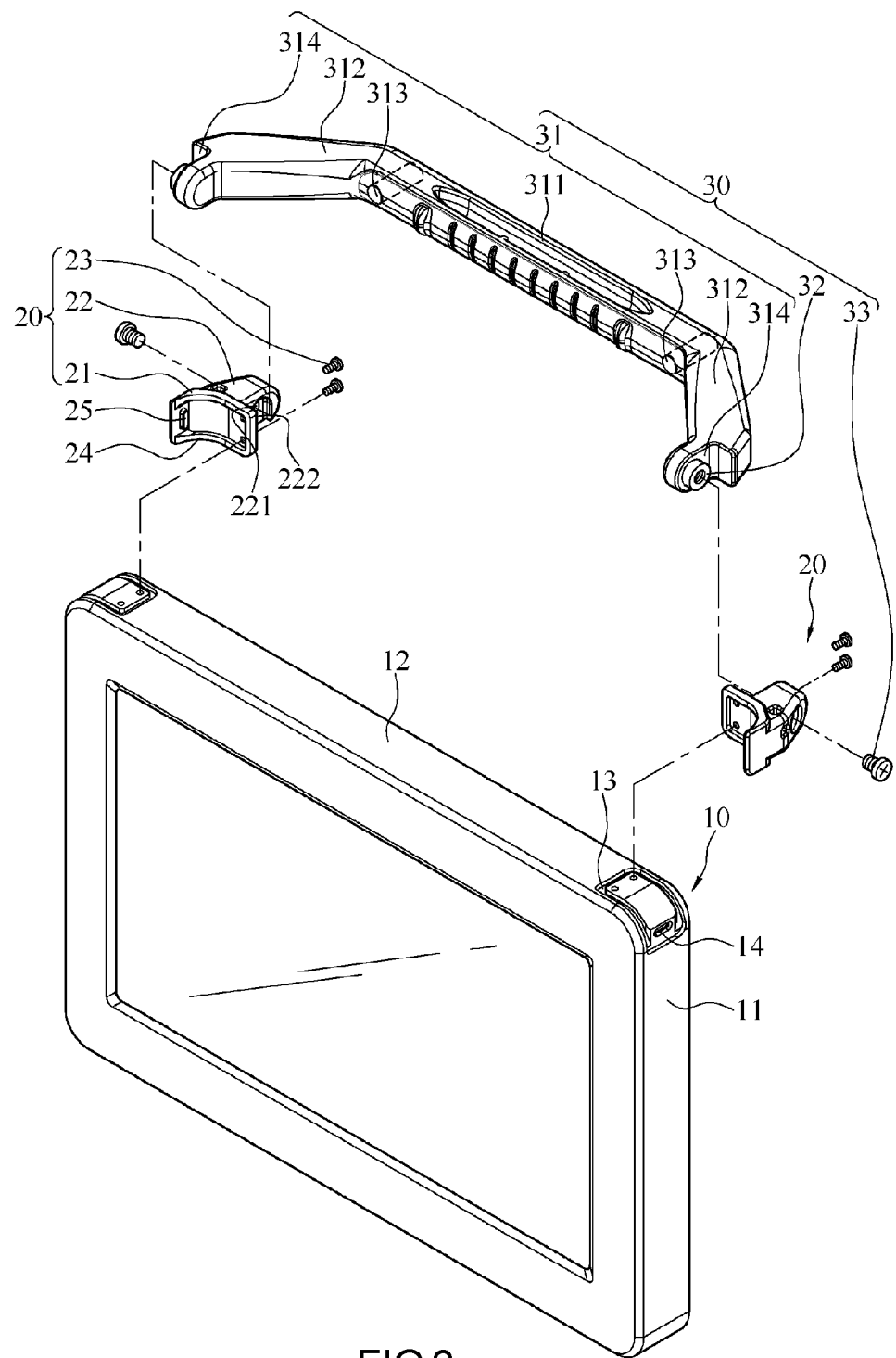
FIG. 2 is an exploded view of the electronic device having a removable handle according to the present invention.
Figure 3:
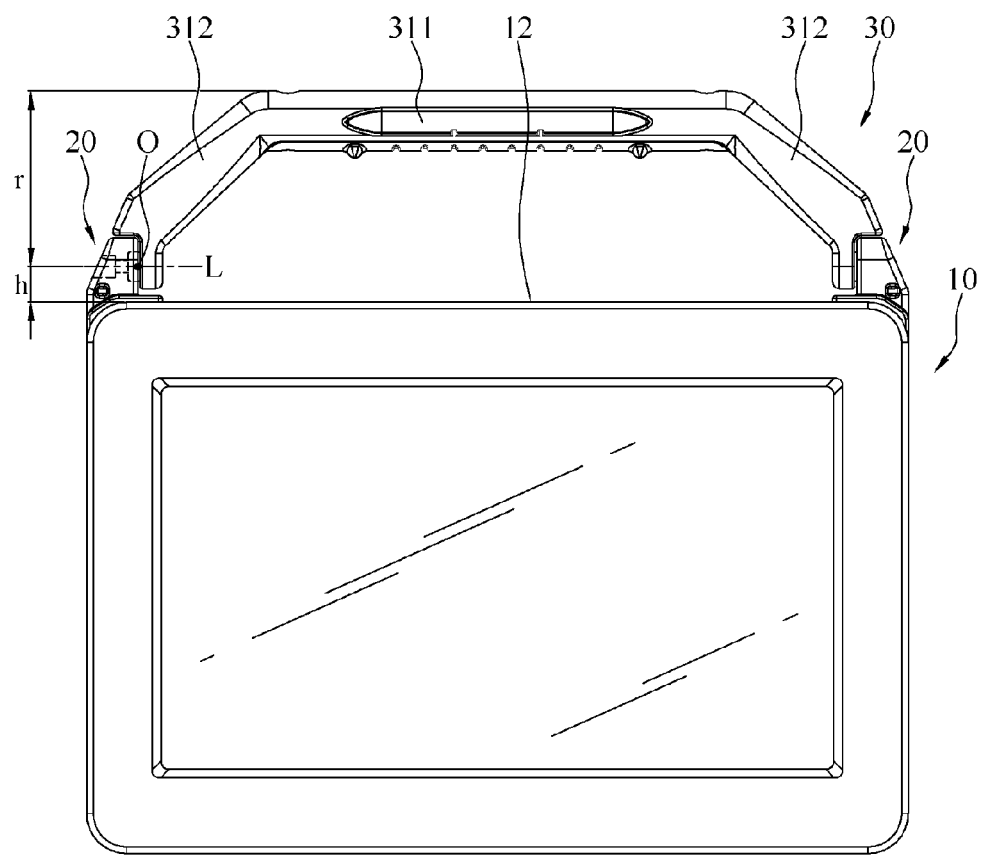
FIG. 3 is a plan of the assembled electronic device having a removable handle according to the present invention.
Figure 4:
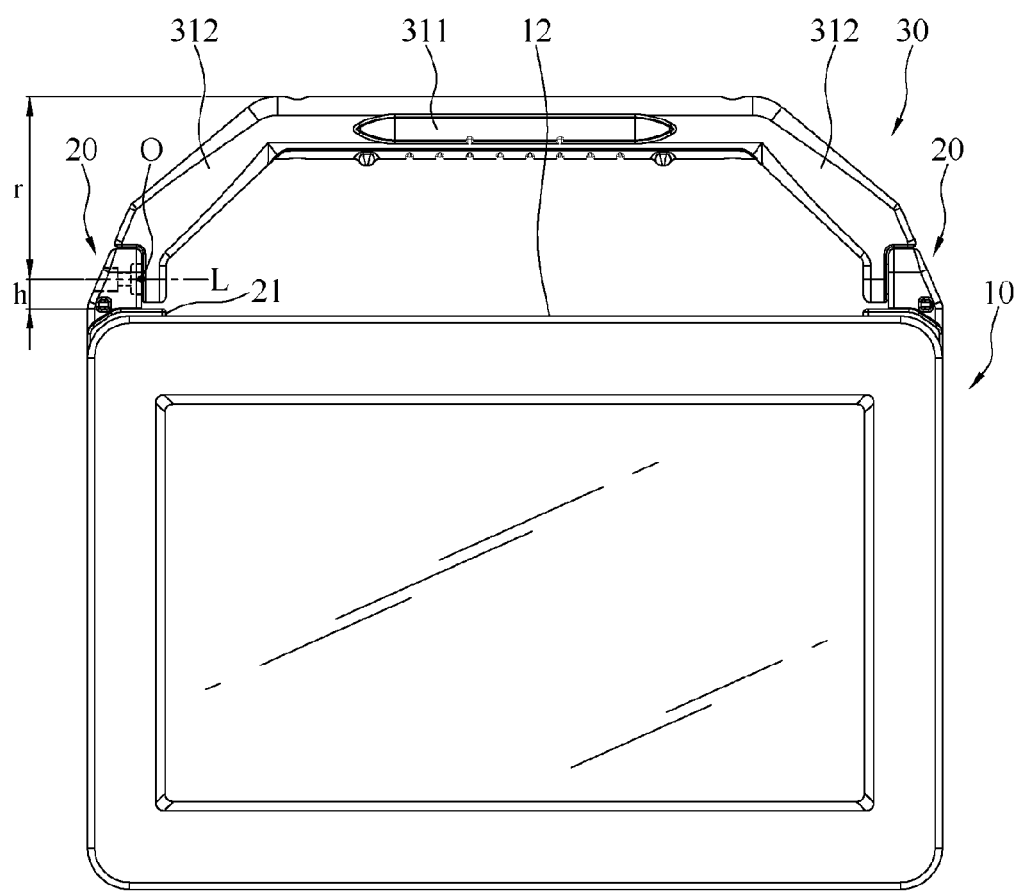
FIG. 4 is a plan of the assembled electronic device having a removable handle according to the present invention.

FIG. 2 is an exploded view of the electronic device having a removable handle according to the present invention. FIG. 3 and FIG. 4 are plans of the assembled electronic device having a removable handle according to the present invention. Referring to FIG. 2, the two connecting elements 20 each comprises a base 21, a pivotal connection unit 22 and a plurality of fastening components 23. The connecting elements 20 each is disposed on one of two opposing lateral sides 11 of the body 10 having two concave portions 14, respectively. The connecting elements 20 each further comprises a positioning flange 24. The positioning flange 24 is disposed on a side the base 21 of the connecting element 20 and faces the body 10. The top side 12 of the body 10 adjoins the two lateral sides 11. Two guiding recesses 13 are concavely disposed on the body 10. In the embodiment of the present invention, each guiding recess 13 has a rectangular profile. Each guiding recess 13 is disposed at the junction of one of the lateral sides 11 and the top side 12. The body 10 further comprises two concave portions 14. The two concave portions 14 are disposed on the two lateral sides 11 of the body 10, respectively. The two concave portions 14 are confined to the guiding recesses 13, respectively.

Figure 5:
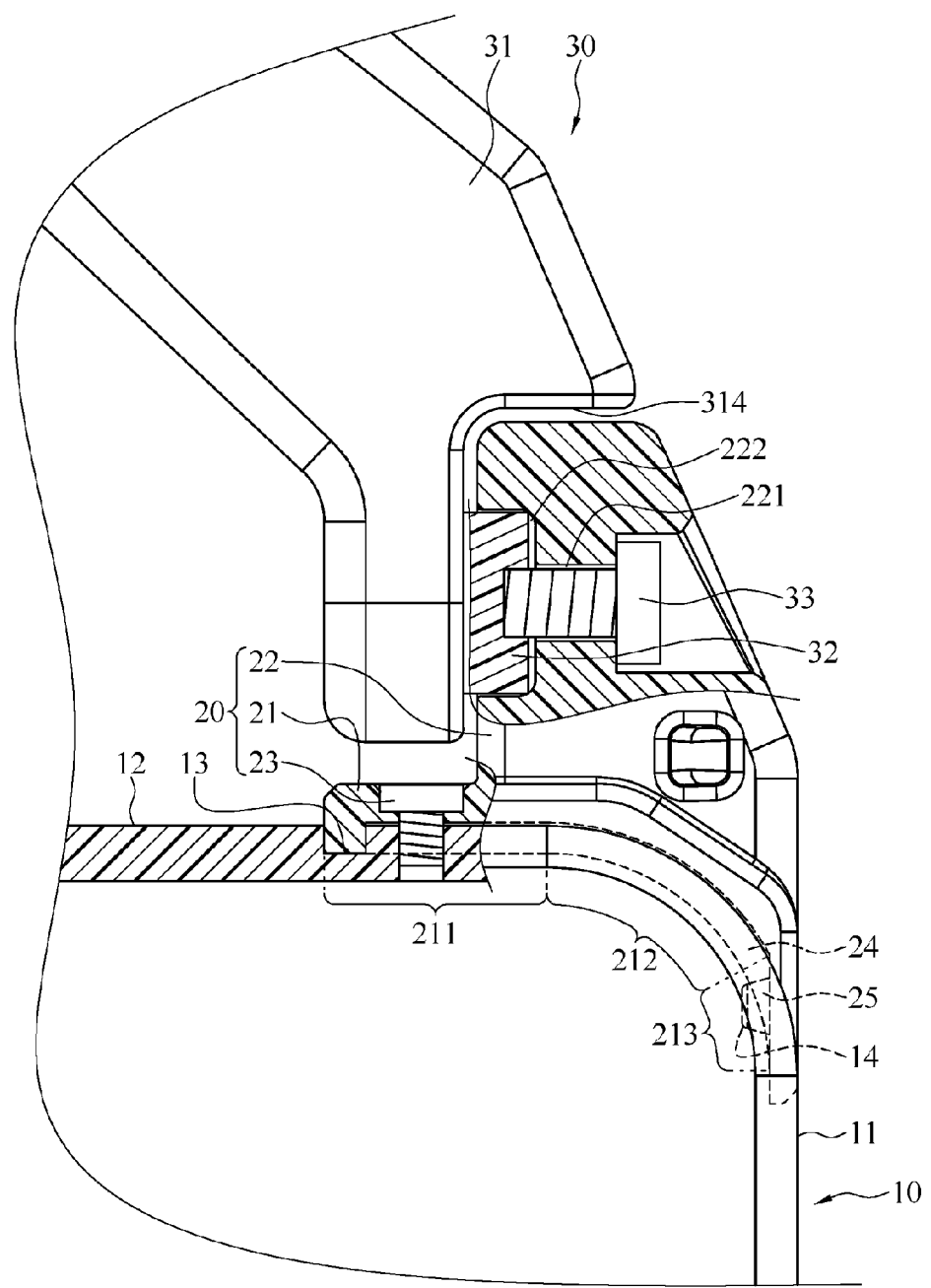
FIG. 5 is a partial enlarged schematic view of the electronic device having a removable handle according to the present invention.
Figure 6:
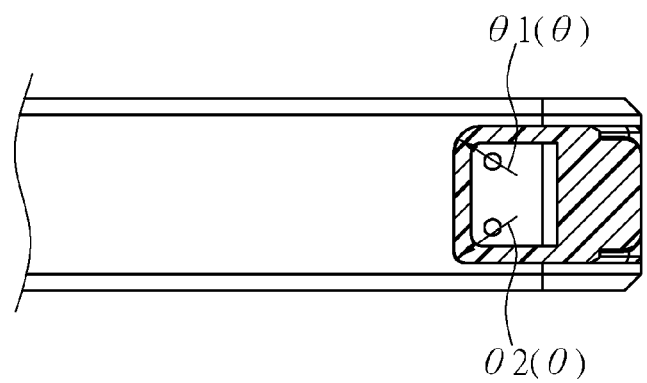
FIG. 6 is a cross-sectional view of the assembled electronic device having a removable handle according to the present invention.

FIG. 5 is a partial enlarged schematic view of the electronic device having a removable handle according to the present invention. FIG. 6 is a cross-sectional view of the assembled electronic device having a removable handle according to the present invention. The base 21 comprises a first abutting segment 211, a second abutting segment 212 and a third abutting segment 213. Referring to FIG. 5, one end of the first abutting segment 211 connects with one end of the second abutting segment 212. The other end of the second abutting segment 212 connects with one end of the third abutting segment 213. The second abutting segment 212 is arcuate. The first abutting segment 211 and the third abutting segment 213 have different lengthwise directions. The other end of the first abutting segment 211 is inclined at lead angle θ. In this embodiment, the two sides of the other end of the first abutting segment 211 are inclined at first lead angle θ1 and second lead angle θ2, respectively, as shown in FIG. 6.

Referring to FIG. 5, in an embodiment of the present invention, the second abutting segment 212 mainly serves as a medium for connecting the first abutting segment 211 and the third abutting segment 213 such that the first abutting segment 211 extends to the second abutting segment 212 and bends before connecting with the third abutting segment 213. In the embodiment of the present invention, considering the 90-degree corners of the body 10 whose faces are rectangular, the second abutting segment 212 has to be ¼ arcuate, but the present invention is not limited thereto, as the present invention covers the situation where the first abutting segment 211 and the third abutting segment 213 at two ends of the second abutting segment 212 extend lengthwise in different directions, respectively.

The third abutting segments 213 of the bases 21 of the connecting elements 20 each has a bump 25. Referring to FIG. 2 and FIG. 5, the bumps 25 differ from the fastening components 23 in lengthwise direction. In this embodiment, the lengthwise directions of the fastening components 23 are perpendicular to the lengthwise directions of the bumps 25, respectively, but the present invention is not limited thereto. With the fastening components 23 being different from the bump 25 in lengthwise directions, the present invention will work, provided that the fastening components 23 and the bumps 25 generate bonding forces exerted in different directions relative to the body 10. The positioning flanges 24 of the bases 21 of the connecting elements 20 are received in the guiding recesses 13 of the body 10, respectively. The bumps 25 are penetratingly disposed in the concave portions 14 of the body 10, respectively. The fastening components 23 each penetrates the first abutting segment 211 of the base 21 and get fastened to the body 10.

Referring to FIG. 2 and FIG. 5, the pivotal connection unit 22 is fixedly disposed at the base 21 and comprises a pivotal connection hole 221 and a mounting recess 222. The pivotal connection hole 221 is disposed on one side of the pivotal connection unit 22, whereas the mounting recess 222 is disposed on the other side of the pivotal connection unit 22, with the pivotal connection hole 221 being in communication with the mounting recess 222.

Referring to FIG. 2 through FIG. 5, the handle 30 is rotatably, pivotally disposed at the two connecting elements 20. The handle 30 comprises a grip element 31, two pivotal connection shafts 32 and two pivotal bolts 33. The grip element 31 of the handle 30 comprises a body segment 311 and two extension segments 312 connected to two ends of the body segment 311, respectively. Two insertion holes 313 are disposed at the body segment 311 of the grip element 31. The direction of the distance between the two ends of each insertion hole 313 differs from the lengthwise direction of the body segment 311. Each extension segment 312 has a recess part 314. The pivotal connection shafts 32 are disposed at the recess parts 314 of the extension segments 312 at the two ends of the grip element 31, respectively.

Referring to FIG. 3 through FIG. 6, the pivotal connection shafts 32 are penetratingly disposed at the mounting recesses 222, respectively, and the recess parts 314 are attached to the pivotal connection units 22 of the connecting elements 20, respectively, with the pivotal bolts 33 penetrating the pivotal connection holes 221 before being penetratingly disposed at the pivotal connection shafts 32, respectively. The grip element 31 rotates about an axis O of each pivotal connection shaft 32; and, in this state, a reference line L which extends in a direction parallel to the body segment 311 is derived from the axis O. The shortest distance between the reference line L and the body segment 311 equals a rotation radius r by which the grip element 31 rotates relative to the connecting elements 20. In the embodiment of the present invention, the axis O of the pivotal connection shafts 32 of the handle 30 is spaced apart from the top side 12 of the body 10 or from the bases 21 of the connecting elements 20 by a distance h, wherein the distance h equals 10% to 35% of the rotation radius r of the grip element 31 of the handle 30, that is, h=0.1 r~0.35 r. In some embodiments, the distance h between the axis O and the bases 21 of the connecting elements 20 equals 16% of the rotation radius r, whereas the distance h between the axis O and the top side 12 of the body 10 equals 20% of the rotation radius r, but the present invention is not limited to the distance h, as the present invention can be easily accomplished by persons skilled in the art, provided that the distance h prevents the body segment 311 and the extension segments 312 of the grip element 31 from rotating until they touch the body 10 but keeps the included angle between the body 10 and the grip element 31 less than 90 degrees.

The structural configuration and relative relationships of the embodiment of the present invention are described above. The embodiment of the present invention mainly enables a user to change the handle 30 as needed. The pivotal connection shafts 32, which are capable of being penetratingly disposed in the mounting recess 222, can be mounted on the connecting elements 20 and therefore coupled to the body 10 so as to be operable, provided that the pivotal connection shafts 32 are disposed at the two ends of the handle 30, respectively, thereby rendering the use of the handle highly flexible.

In the embodiment of the present invention, not only is the handle 30 changeable, but considerations are also given to the usage safety after the handle 30 has been mounted in place, as described below. According to the present invention, the handle 30 connects with the body 10 through the connecting elements 20. The base 21 of each the connecting element 20 is formed in a manner to be constructed by the connection of the first abutting segment 211, the second abutting segment 212 and the third abutting segment 213, and the first abutting segment 211 differs from the third abutting segment 213 in lengthwise direction, so that the connecting elements 20 are positioned on different planes. In the embodiment of the present invention, the connecting elements 20 can be simultaneously attached to the top side 12 and one of the lateral sides 11 of the body 10. Then, with the concave portions 14 and bumps 25 being disposed on the lateral side 11 and fitted together, and the fastening components 23 being fastened to the top side 12, each connecting element 20 generates two bonding forces in two different directions relative to the body 10 to enhance the stability of connection between the handle 30 and the body 10 and ensure the usage safety of using the handle 30 to carry the body 10.

Still, out of the same safety consideration, the embodiment of the present invention is further characterized in that: the recess parts 314 are disposed on the extension segments 312 of the grip element 31 of the handle 30; after the handle 31 has been pivotally connected to the connecting elements 20, the handle 30 is attached to the pivotal connection units 22 of the connecting elements 20 through the recess parts 314 of the grip element 31 such that the handle 30 exerts upon the connecting elements 20 a limiting force in one direction for reducing the chance that the connecting elements 20 will separate from the handle 30, thereby enhancing the stability of the handle 30 coupled to the body 10.

Moreover, the embodiment of the present invention not only gives considerations to structural stability after assembly, but also gives considerations to foolproof measures and convenience upon assembly. In the embodiment of the present invention, the pivotal connection shafts 32 of the handle 30 are penetratingly disposed in the mounting recess 222 of the connecting elements 20 before effectuating pivotal connection together with the pivotal bolts 33; hence, the pivotal connection shafts 32 are preliminarily limited as soon as they are inserted into the mounting recess 222; therefore, the handle 30 is in a stable state such that, to mount the handle 30 in place, a user fastens the pivotal bolts 33 to the handle 30 in a stable state, thereby enhancing the ease of assembly. Furthermore, due to the aforesaid structural feature, since the handle 30 has been preliminarily positioned before the pivotal bolts 33 are fastened thereto, even if the pivotal bolts 33 loosen after a time period of use, the pivotal connection shafts 32 of the handle 30 will be limited by the mounting recess 222 and therefore unlikely to loosen, thereby enhancing usage safety.

Moreover, the guiding recesses 13 are disposed on the two opposing lateral sides 11 of the body 10, respectively, whereas the positioning flanges 24 corresponding in position to the guiding recesses 13 are disposed on the connecting elements 20, respectively, such that the guiding recesses 13 guide the user to put the connecting elements 20 in the guiding recesses 13, respectively, accurately, and quickly. In addition, the first abutting segments 211 of the bases 21 of the connecting elements 20 are inclined at lead angle θ to enhance ease of assembly during the assembly process.

In the embodiment of the present invention, the two sides of the other end of the first abutting segment 211 of the base 21 of each connecting element 20 are inclined at first lead angle θ1 and second lead angle θ2, respectively. To mount the connecting elements 20 in place, it is only necessary to tilt them by lead angle θ accurately in order for the connecting elements 20 to be correctly oriented and therefore located at an assembly point for being coupled to the handle 30, so as to not only reduce the likelihood of redoing disassembly and assembly because of assembly-related errors but also enhance ease of assembly.

Figure 7:
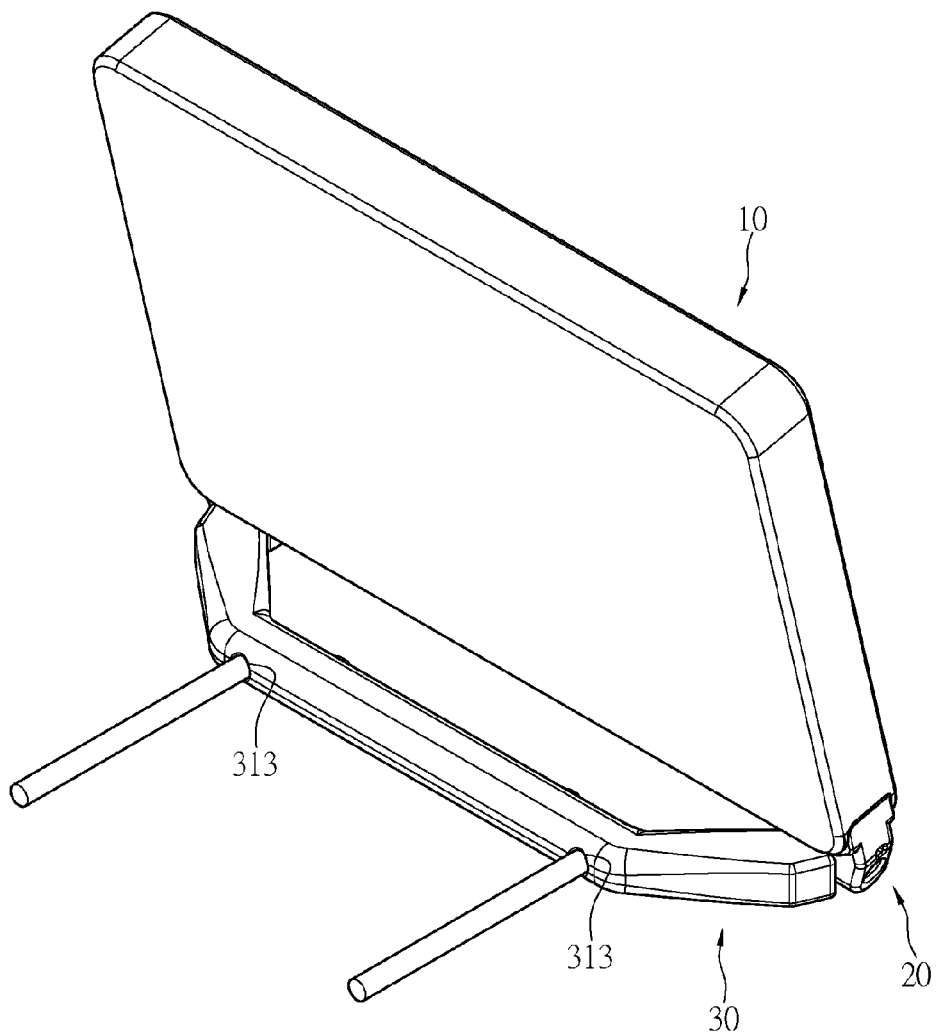
FIG. 7 is a schematic view of the use of a bent handle of the electronic device having a removable handle according to the present invention.

In the embodiment of the present invention, not only does the user carry the body 10 through the handle 30, but the handle 30 is also bent and placed flatly on a table for serving a supportive purpose, thereby increasing the value added of products, as shown in FIG. 7, which is a schematic view of the use of a bent handle of the electronic device having a removable handle according to the present invention.

The embodiment of the present invention gives considerations to avoid adding to structural complexity by achieving the aforesaid objective with existing structures. To this end, the embodiment of the present invention features the relationship under which the handle 30 is disposed at the connecting elements 20 relative to the body 10 in a manner to define the shortest distance between the pivotal axis (i.e., the axis θ of the pivotal connection shafts 32) about which the handle 30 pivotally connects with the connecting elements 20 and the top side 12 of the body 10 as equal to 10% to 35% of the rotation radius r of the grip element 31. Therefore, after rotating relative to the connecting elements 20 beyond the axis θ and therefore have been moving toward the body 10, the handle 30 can only further rotate by 10 to 35% of 90 degrees; in other words, after rotating beyond the axis θ and therefore have been moving toward the body 10, the handle 30 can only further rotate by 9 to 31.5 degrees before it is stopped. Accordingly, the handle 30 is finally limited to form an included angle of 81 to 58.5 degrees with the body 10 so as to enhance ease of use and provide firm support. In the embodiment of the present invention, after being disposed at the guiding recesses 13, the bases 21 of the connecting elements 20 protrude from the top side 12 of the body 10, and therefore the rotating handle 30 eventually stops at the connecting elements 20, but the present invention is not restrictive of the aforesaid structural features of the connecting elements 20. If the bases 21 of the connecting elements 20 are disposed at the guiding recesses 13 in a manner to be at a lower height than the top side 12 of the body 10, the distance h between the top side 12 of the body 10 and the axis O of the pivotal connection shafts 32 of the handle 30 will equal 10% to 35% of the rotation radius r, and in consequence not only is the angle of rotation of the handle 30 limited by the body 10, but the destination of the rotating handle 30 also forms an angle of 58.5 to 81 degrees with the body 10.

The embodiment of the present invention not only dispenses with a positioning structure or angle limit structure and achieves this purpose by varying a position-related parameter of the configuration of components, but also provides additional functions without incurring extra costs, thereby effectuating high value-added products.

The present invention is not restricted of the aforesaid ranges of angles. The distance h can be reduced such that the included angle between the body 10 and the handle 30 approximates 90 degrees. Conversely, the distance h can be increased to reduce the included angle between the body 10 and the handle 30, depending on user needs. The aforesaid changes can be easily accomplished by persons skilled in the art.

Furthermore, in the situation where the handle 30 serves as a support for supporting the body 10, the user can insert slender articles, such as styli or pens, into the two insertion holes 313 disposed on the body segment 311 of the grip element 31 of the handle 30 such that the slender articles in the two insertion holes 313 further provide extra support, thereby enhancing the support stability of the handle 30.

In conclusion, the embodiment of the present invention is characterized in that: the handle 30 is pivotally disposed at the connecting elements 20; the connecting elements 20 are fixedly disposed at the body 10; the handle 30 can be changed as needed and thus its use is highly flexible; the connecting elements 20 get coupled to the body 10 in two different directions to thereby enhance the overall structural stability after assembly and usage safety of the handle; and the handle 30 can be bent to serve as a support for supporting the body 10, thereby enhancing ease of use.

What is claimed is:

1. An electronic device having a removable handle, comprising:

a body having two concave portions disposed on two opposing lateral sides of the body, respectively;

two connecting elements each disposed on each of the two opposing lateral sides of the body having the concave portions, respectively, with the connecting elements each comprising a base, a pivotal connection unit and a plurality of fastening components, and the base comprises a bump penetrating one of the concave portions of the body, wherein the fastening components penetrate the base and get fastened to the body, and the pivotal connection unit is fixedly disposed at the base and comprises a pivotal connection hole and a mounting recess;

a handle, pivotally disposed at the connecting elements and comprising a grip element, two pivotal connection shafts each having a thread hole in an axis of the two pivotal connection shafts; and two pivotal bolts, wherein the pivotal connection shafts are disposed at two ends of the grip element and are penetratingly disposed at the mounting recesses, respectively; wherein each of the pivotal bolts penetrating each of the pivotal connection holes is penetratingly disposed at each of the pivotal connection shafts, respectively; wherein the two pivotal bolts are fastened to two thread holes of the two pivotal connection shafts when the removable handle is in a stable state;

wherein the grip element of the handle comprises a body segment and two extension segments connected to two ends of the body segment, respectively, with the pivotal connection shafts disposed at the extension segments, respectively; and wherein an insertion hole is disposed on the body segment of the grip element, and a direction of a distance between two ends of the insertion hole differs from a lengthwise direction of the body segment.

2. The electronic device having a removable handle according to claim 1, wherein the bumps differ from the fastening components in lengthwise direction, respectively.

3. The electronic device having a removable handle according to claim 1, wherein a distance h from the axis of the pivotal connection shafts of the handle to one of a top side of the body and the bases of the connecting elements equals 10% to 35% of a rotation radius r of the grip element of the handle.

4. The electronic device having a removable handle according to claim 1, wherein the extension segments each has a recess part, with the pivotal connection shafts disposed at the recess parts, respectively, and the recess parts of the grip element are attached to the pivotal connection units of the connecting elements, respectively.

5. An electronic device having a removable handle, comprising:

a body having two concave portions disposed on two opposing lateral sides of the body, respectively;

two connecting elements each disposed on each of the two opposing lateral sides of the body having the concave portions, respectively, with the connecting elements each comprising a base, a pivotal connection unit and a plurality of fastening components, and the base comprises a bump penetrating one of the concave portions of the body, wherein the fastening components penetrate the base and get fastened to the body, and the pivotal connection unit is fixedly disposed at the base and comprises a pivotal connection hole and a mounting recess;

a handle, pivotally disposed at the connecting elements and comprising a grip element, two pivotal connection shafts each having a thread hole in an axis of the two pivotal connection shafts; and two pivotal bolts, wherein the pivotal connection shafts are disposed at two ends of the grip element and are penetratingly disposed at the mounting recesses, respectively, wherein each of the pivotal bolts penetrating each of the pivotal connection holes is penetratingly disposed at each of the pivotal connection shafts, respectively, wherein the two pivotal bolts are fastened to two thread holes of the two pivotal connection shafts when the removable handle is in a stable state, and wherein the bases of the connecting elements each comprises a first abutting segment, a second abutting segment, and a third abutting segment, the first abutting segment having an end connected to an end of the second abutting segment, the second abutting segment having another end connected to an end of the third abutting segment, the second abutting segment being arcuate, and the first abutting segment being different from the third abutting segment in lengthwise direction.

6. The electronic device having a removable handle according to claim 5, wherein the fastening components penetrate the first abutting segments of the bases and get fastened to the body.

7. The electronic device having a removable handle according to claim 6, wherein the bumps are disposed at the third abutting segments of the bases.

8. The electronic device having a removable handle according to claim 5, wherein the connecting elements each comprises a positioning flange disposed on a side of a corresponding one of the bases of the connecting elements and facing the body.

9. The electronic device having a removable handle according to claim 5, wherein another end of the first abutting segment is inclined at a lead angle.

* * * * *